(12) United States Patent
Liu et al.

(10) Patent No.: US 6,950,972 B2
(45) Date of Patent: Sep. 27, 2005

(54) MULTI-PURPOSE BER TESTER (MPBERT) FOR VERY HIGH RZ AND NRZ SIGNALS

(75) Inventors: Tiangong Liu, Mountain View, CA (US); Jinghui Li, San Jose, CA (US); Tongqing Wang, Los Altos, CA (US)

(73) Assignee: Oplink Communications, Inc., Fremont, CA (US)

(*) Notice: Subject to any disclaimer, the term of this patent is extended or adjusted under 35 U.S.C. 154(b) by 387 days.

(21) Appl. No.: 09/988,059

(22) Filed: Nov. 16, 2001

(65) Prior Publication Data

US 2003/0097622 A1 May 22, 2003

(51) Int. Cl.[7] .......................... G06F 11/00; H04B 10/08
(52) U.S. Cl. ........................................ 714/714; 398/27
(58) Field of Search ............................... 714/704, 705, 714/712, 713; 398/27, 25, 183, 202; 341/69; 359/326

(56) References Cited

U.S. PATENT DOCUMENTS 5,548,399 A * 8/1996 Takai et al. .................. 356/218
6,469,823 B2 * 10/2002 Kikuchi et al. ............. 359/326

OTHER PUBLICATIONS

Sokolowska et al., Application of optoelectronic techniques to high speed testing, 1994, IEEE, p. 710–719.*
Shake et al, Determination of the origin BER degradation utlizing asynchronous amplitude histograms, Jul. 2001, Laser & Electro–Optics 2001 C/EO? Pasific RIM 2001.vol. 2. the 4th Pacific Rim Conference vol. 2., p. II–560 to II–561.*

Jae Lee et al., Polarisation–independntt, stable, all optical clock recovery using an SOA/grating filter wavelength converter, Aug. 1999, Electronics Letters vol. 35, No. 16, p. 1368–1370.*

Mikkelsen et al., 40Gbit/s all–optical wavelength converter and RZ to NRZ format adapter realsied by monolithic integrated active Michelson interferometer, Jan. 1997, Electronic Letters vol. 33, No. 2, p. 133–134.*

* cited by examiner

Primary Examiner—Shelly Chase
(74) Attorney, Agent, or Firm—Fish & Richardson P.C.

(57) ABSTRACT

A multi-purpose bit error rate tester (MPBERT) and a method of bit error rate (BER) testing of electrical and optical components and subsystems of electrical and optical communications systems is provided. The invention provides for bit error rate testing both in the optical and the electrical domain, and for bit error rate testing at higher than achievable rates in the electrical domain by multiplexing and demultiplexing in the optical domain. An MPBERT constructed according to the invention incorporates at least one optical multiplexer, and advantageously incorporates at least one optical demultiplexer, and in some embodiments uses high data rate optical RZ to NRZ conversion and high data rate optical NRZ to RZ conversion.

11 Claims, 12 Drawing Sheets

MULTI-PURPOSE BER TESTER (MPBERT) FOR VERY HIGH RZ AND NRZ SIGNALS

FIELD OF THE INVENTION

This invention relates to the testing of electrical and optical communications systems, and more particularly to the bit error rate testing of electrical and optical communications systems, electrical and optical components and subsystems therein.

BACKGROUND OF THE INVENTION

In order to maintain and operate a communications system efficiently and effectively, the performance and operability of its components and subsystems should be tested and measured before being integrated into the system. One measure of the performance and operability of components and subsystems is a measurement of a bit error rate (BER). Bit error rate testers (BERTs) are designed specifically to test components and subsystems of digital communications systems.

The term "device under test" (DUT) referred to hereinafter is to be understood to mean a component or a subsystem or a grouping thereof which may comprise either optical or electrical subparts or any combination thereof. To be a compatible DUT for BER testing, the DUT must be designed to output the same data pattern it receives irrespective of what happens to the data pattern inside the DUT.

The rate of bits incorrectly conveyed through a DUT is a measure of the bit error rate of that device, and is an indication of the performance and operability of the device.

Referring to FIGS. 1A, and 1B, the operation of standard bit error rate testing arrangements is described. Referring first to FIG. 1A, a standard BER testing arrangement using an electrical signal, is described. A BERT 100 is connected by an output 102 and an input 104 to an input 122 and an output 124 respectively of a DUT 120. The BERT 100 has a Programmable Pattern Generator (PPG) 110, which produces a known test pattern at an output 112, which is connected to the output 102 of the BERT 100. The PPG 110 also outputs a separate clock signal at clock output 114 at a selected data rate. The known test pattern, which is typically a pseudo random binary sequence (PRBS), is injected into the DUT 120 at the selected data rate. The input 104 of the BERT 100 is connected to an input 132 of an Error Detector (ED) 130 of the BERT 100. The Error Detector 130 has its own pattern generator which produces an exact replica of the known test pattern produced by the PPG 110, and also has a comparator. The comparator of the ED 130 checks every bit received at the BERT input 104 from the DUT 120 against the known pattern internally generated by the ED 130. Each time the received bit differs from the known transmitted bit an error is logged. The PPG 110 and the ED 130, are made to operate at identical clock rates with a stable phase relationship between them by using the clock output 114 of the PPG 110 to trigger the ED 130 at clock input 133. The PPG clock 114 can effectively trigger the ED 130 only when the BERT 100 and the DUT 120 are in close proximity. When they are physically separated, for example at opposite ends of a transmission link, the PPG clock might not be in phase with the transmitted data, in which case the PPG clock 114 would not be able to trigger the ED 130. In this case the ED 130 should be triggered by a recovered clock obtained directly from the data itself.

In order to set up a BER testing arrangement for optical signals additional components are required. Referring to FIG. 1B, a BER testing arrangement using optical signals is described. The output 112 of the PPG 110, is connected to an electrical input 141 of a modulator 140 which modulates a CW laser source 143. An optical signal output from an optical output 142 of the modulator 140 passes through an optical output 102 of the BERT 100 over an optical fiber 144 to an optical input 122 of an optical DUT 120. An optical output 124 of the DUT 120 is connected by an optical fiber 145, through an optical input 104 of the BERT 100 to an optical input 151 of an optical receiver 150. An electrical data output 152 and a recovered clock output 153 of the optical receiver 150 are connected respectively to the data input 132 and clock input 133 of the ED 130. As was the case for testing electrical devices, the Error Detector 130 generates an exact replica of the known test pattern produced by the PPG 110, and also has a comparator which checks every bit received at the BERT input 104 from the DUT 120 against the known pattern internally generated by the ED 130. Each time the received bit differs from the known transmitted bit an error is logged. The ED 130 is triggered by the recovered clock from clock output 153 of the optical receiver 150 which has been recovered directly from the data itself.

For both arrangements and in general when testing numerous optical and/or electrical components in a subsystem, testing typically is done systematically, each subsystem having its own BER characterized in isolation and then in combination with other components in a step by step manner.

In general, there are two common data formats for the transmission of high-speed digital data, Non-Return to Zero (NRZ) signal format and Return to Zero (RZ) signal format. Non-Return to Zero (NRZ) signal format is the more popular of the two formats due to its inherent simplicity. In this particular format, each "0" or "1" data bit is represented by a low or high signal level, respectively, lasting an entire clock period. However, with ever-increasing data rates, especially in optical transmission systems, Return-to-Zero (RZ) signal formats are becoming the transmission format of choice. In RZ modulation format, each data bit occupies only a portion of the clock period creating a distinct transition between adjacent bits and, thereby, producing a cleaner optical signal for the receiver to read. For high-rate (>10 Gbps) or ultra-long-haul (>1000 km) transmission, the RZ modulation technique is now coming into vogue as it affords certain efficiency gains such as higher signal-to-noise ratio (SNR) and lower crosstalk amongst adjacent bits. RZ encoding also offers better immunity to fiber nonlinear effects and the effects of polarization mode dispersion (PMD), factors which can limit long-haul or high-rate transmission severely. Given the rising importance and popularity of this data format, components and subsystems designed to work with optical RZ signals should be BER tested with appropriate optical RZ signals.

In modern digital communications, data signals are being used at higher and higher data rates. Because of the physical constraints of systems in the electrical domain, it is often, if not always the case, that in the optical domain higher data rate components and subsystems are achieved before corresponding electrical components and subsystems are achieved. In order to test optical systems at data rates higher than that generally achievable in the electrical domain the use of optical multiplexers to achieve the desired rate for testing the high data rate optical DUT would be required. The use of optical demultiplexers would also be required to reduce the data rate coming back from the high data rate optical DUT to a manageable level. Current BER testers do not incorporate optical multiplexers to produce high data rate PRBSs and optical demultiplexers to reduce the data rate of the test to a level which can be processed by an electrical based error detector. Testing a modern digital communications systems with components or subsystems in both the optical and electrical domains, and having both high optically achievable data rates and data rates achievable in the electrical domain, would require multiple BERTs, and custom set-up of optical apparatus to add high rate optical functionality. To design and set-up such a cutting edge custom built set-up could be extremely difficult and time consuming. Such a time sensitive task as BER testing critical components of a communications system could therefore become expensive, and inefficient. It would be desirable for there to be a multi-purpose bit error rate tester which is capable of bit error rate testing both in the optical and the electrical domain. Moreover it would also be desirable if the bit error rate tester could perform BER tests at higher than the achievable rates in the electric domain, so that cutting edge optical components and subsystems could be tested without the need to set up custom testing apparatus.

SUMMARY OF THE INVENTION

The present invention provides for a multi-purpose bit error rate tester (MPBERT) which is capable of bit error rate testing both in the optical and the electrical domain. Moreover the present invention provides for an MPBERT that can perform BER tests at higher than the achievable rates in the electric domain, so that cutting edge optical components and subsystems can be tested without the need to set up custom testing apparatus.

An MPBERT constructed according to invention has the ability to test optical components at data rates BERTs based solely on multiplexing and demultiplexing in the electrical domain cannot. In general this advantage is gained by using an optical multiplexer and demultiplexer approach. Instead of relying on the user of the bit error rate tester to supply a custom built apparatus for testing high data rate optical components and subsystems, an MPBERT built according to the invention incorporates at least one optical multiplexer, advantageously may include at least one optical demultiplexer, and advantageously may use high data rate optical RZ to NRZ conversion and high data rate optical NRZ to RZ conversion.

According to a first broad aspect, the invention provides for a bit error rate tester having an optical multiplexer for multiplexing at least one test pattern data signal for injection into a device under test, and an optical pulse source from which an optical pulse stream is provided to the optical multiplexer to be modulated with the at least one test pattern data signal multiplexed therein.

Advantageously, some embodiments of the invention provide for a bit error rate tester having an optical demultiplexer for demultiplexing a recovered data signal from the device under test.

Some embodiments of the invention provide for an optical converter adapted to convert an optical RZ signal having a data rate into an optical NRZ signal having the same data rate and an electrical NRZ signal having the same data rate, in which the optical RZ Signal the converter is adapted to convert is an optical RZ signal produced by the optical multiplexer, and in which the optical NRZ signal and the electrical NRZ signal are for injection into the device under test.

Some embodiments of the invention provide for an optical converter adapted to convert an optical NRZ signal having a data rate into an optical RZ signal having the same data rate, in which the optical NRZ signal the optical converter is adapted to convert is an optical NRZ recovered data signal from the device under test.

Some embodiments of the invention provide for an optical converter having a PIN photodiode/transimpedance amplifier for converting an optical RZ signal into an electrical RZ signal, a low pass filter and a limit amplifier for converting an electrical RZ signal into an electrical NRZ signal, and an optical continuous wave source and an electro-absorption modulator for converting an electrical NRZ signal into an optical NRZ signal.

Some embodiments of the invention provide for an optical converter having a PIN photodiode/transimpedance amplifier for converting an optical NRZ signal into an electrical NRZ signal, and an optical pulse source synchronized with the electrical NRZ signal modulated by an electro-absorption modulator for converting an electrical NRZ signal into an optical RZ signal.

According to a second broad aspect, the invention provides for a bit error rate tester having an optical multiplexer for multiplexing at least one test pattern data signal for injection into a device under test, an optical pulse source from which an optical pulse stream is provided to the optical multiplexer to be modulated with the at least one test pattern data signal multiplexed therein, an optical demultiplexer for demultiplexing a recovered data signal from the device under test, a first optical converter adapted to convert a first optical RZ signal having a first data rate into a first optical NRZ signal having the first data rate and a first electrical NRZ signal having the first data rate, in which the first optical RZ signal the first optical converter is adapted to convert is an optical RZ signal produced by the optical multiplexer, and in which the first optical NRZ signal and the first electrical NRZ signal are for injection into the device under test, and a second optical converter adapted to convert a second optical NRZ signal having a second data rate into a second optical RZ signal having the second data rate, wherein the second optical NRZ signal the second optical converter is adapted to convert is an optical NRZ recovered data signal from the device under test.

Some embodiments of the invention provide for a first optical converter having a first PIN photodiode/transimpedance amplifier for converting the first optical RZ signal into an electrical RZ signal, a low pass filter and a limit amplifier for converting the electrical RZ signal into a second electrical NRZ signal, and an optical continuous wave source and a first electro-absorption modulator for converting the second electrical NRZ signal into the first optical NRZ signal, and a second optical converter having a second PIN photodiode/transimpedance amplifier for converting the second optical NRZ signal into a third electrical NRZ signal, and an optical pulse source synchronized with the third electrical NRZ signal and a second electro-absorption modulator for converting the third electrical NRZ signal into the second optical RZ signal.

According to a third broad aspect, the invention provides for a method of bit error rate testing comprising optically multiplexing at least one test pattern data signal for injection into a device under test.

Advantageously, some embodiments of the invention provide for a method of bit error rate testing further comprising optically demultiplexing a recovered data signal from the device under test.

Some embodiments of the invention provide for optically converting an optical RZ signal having a data rate into an optical NRZ signal having the same data rate and an electrical NRZ signal having the same data rate, in which the optical RZ signal is a multiplexed optical RZ signal, and wherein the optical NRZ signal and the electrical NRZ signal are for injection into the device under test.

Some embodiments of the invention provide for optically converting an optical NRZ signal having a data rate into an optical RZ signal having the same data rate, in which an optical NRZ signal is a multiplexed optical NRZ recovered data signal from the device under test.

Some embodiments of the invention provide for converting an optical RZ signal into an electrical RZ signal, converting an electrical RZ signal into an electrical NRZ signal, and converting an electrical NRZ signal into an optical NRZ signal.

Some embodiments of the invention provide for converting an optical NRZ signal into an electrical NRZ signal, and converting an electrical NRZ signal into an optical RZ signal.

According to a fourth broad aspect, the invention provides for a method of bit error rate testing comprising optically multiplexing at least one test pattern data signal for injection into a device under test, optically demultiplexing a recovered data signal from the device under test, optically converting a first optical RZ signal having a first data rate into a first optical NRZ signal having the first data rate and a first electrical NRZ signal having the first data rate, in which the first optical RZ signal is a multiplexed optical RZ signal, and wherein the first optical NRZ signal and the first electrical NRZ signal are for injection into the device under test, and optically converting a second optical RZ signal having a second data rate into a second optical RZ signal having the second data rate, in which the second optical NRZ signal is a multiplexed optical NRZ recovered data signal from the device under test.

Other aspects and features of the present invention will become apparent to those of ordinary skill in the art upon review of the following description of specific embodiments of the invention in conjunction with the accompanying figures.

BRIEF DESCRIPTION OF THE DRAWINGS

The invention will now be described in greater detail with reference to the accompanying diagrams, in which.

DETAILED DESCRIPTION OF THE PREFERRED EMBODIMENTS

Figure 1A:
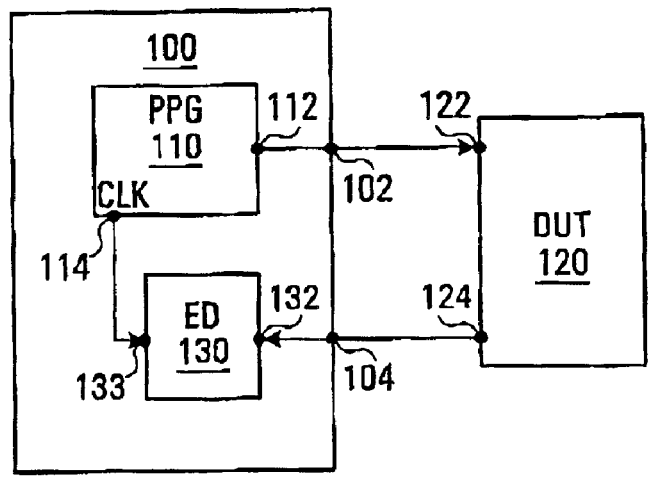
FIG. 1A is a diagram of a standard BER testing arrangement for testing devices in the electrical domain.
Figure 1B:
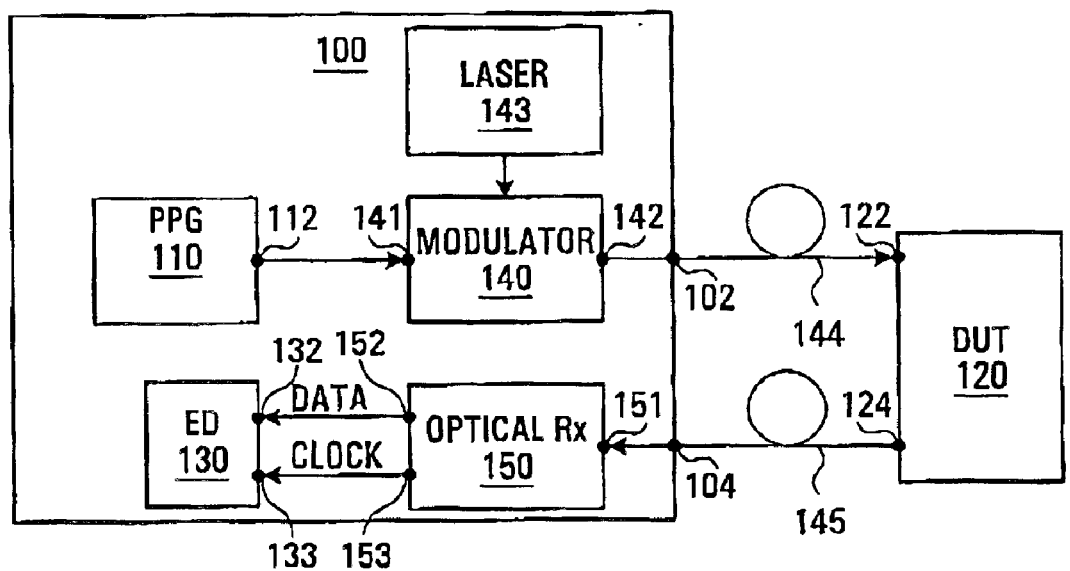
FIG. 1B is a diagram of a standard BER testing arrangement for testing devices in the optical domain.

The following descriptions and their accompanying figures are examples of bit error rate testing arrangements in which an embodiment of the invention may be used. As such, they are not to be construed as all possible uses to which the Multi-Purpose Bit Error Rate Tester (MPBERT) may be put, but instead are examples of the preferred arrangements for use with an embodiment of the invention. The examples given are at a 40 gigabits per second (Gbps) data rate. Other embodiments constructed according to the invention are envisioned which provide higher rate data signals and test components and subsystems of higher data rate specifications for example in the 80 Gbps and 160 Gbps regimes and beyond.

With reference to FIGS. 2, 3, 4, 5, 6, 7, and 8, arrangements including an MPBERT 200 constructed according to an embodiment of the invention, are described. In the embodiments of the example arrangements shown, the MPBERT 200 consists of two parts. A 10 Gbps NRZ Source/BER Detector 250, and a 40 Gbps RZ and NRZ Source and Detector 260. The 10 Gbps NRZ Source/BER Detector 250 delivers multiple 10 Gbps NRZ electrical PRBS signals at data outputs 251, 252, 253, and 254, and a 10 GHz clock signal at clock output 256, and accepts multiple 10 Gbps recovered data signals at inputs 258a, 258b, 258c, and 258d and a 10 GHz recovered clock signal at clock input 259, and will be described in more detail below. The 40 Gbps RZ and NRZ Source and Detector 260 has data inputs 261, 262, 263, and 264, a 10 GHz clock input 266, multiple 10 Gbps recovered data outputs 268a, 268b, 268c, and 268d and a 10 GHz recovered clock output 269, connected respectively to the data outputs 251, 252, 253, and 254, the clock output 256, recovered data inputs 258a, 258b, 258c, and 258d and the recovered clock input 259, of the 10 Gbps NRZ Source/BER Detector 250. The 40 Gbps RZ and NRZ Source and Detector 260 has an optical 40 Gbps RZ output 370, an optical 40 Gbps NRZ output 371, an optical 40 Gbps RZ and NRZ input 372, a 10 GHz clock output 373, a 20 GHz clock output 374, an electrical 40 Gbps NRZ output 375, two electrical 20 Gbps NRZ outputs 376, 377, and an electrical 40 Gbps NRZ input 378, connected respectively to an optical 40 Gbps RZ output 270, an optical 40 Gbps NRZ output 271, an optical 40 Gbps RZ and NRZ input 272, a 10 GHz clock output 273, a 20 GHz clock output 274, an electrical 40 Gbps NRZ output 275, two electrical 20 Gbps NRZ outputs 276, 277, and an electrical 40 Gbps NRZ input 278 of the MPBERT 200.

Figure 2:
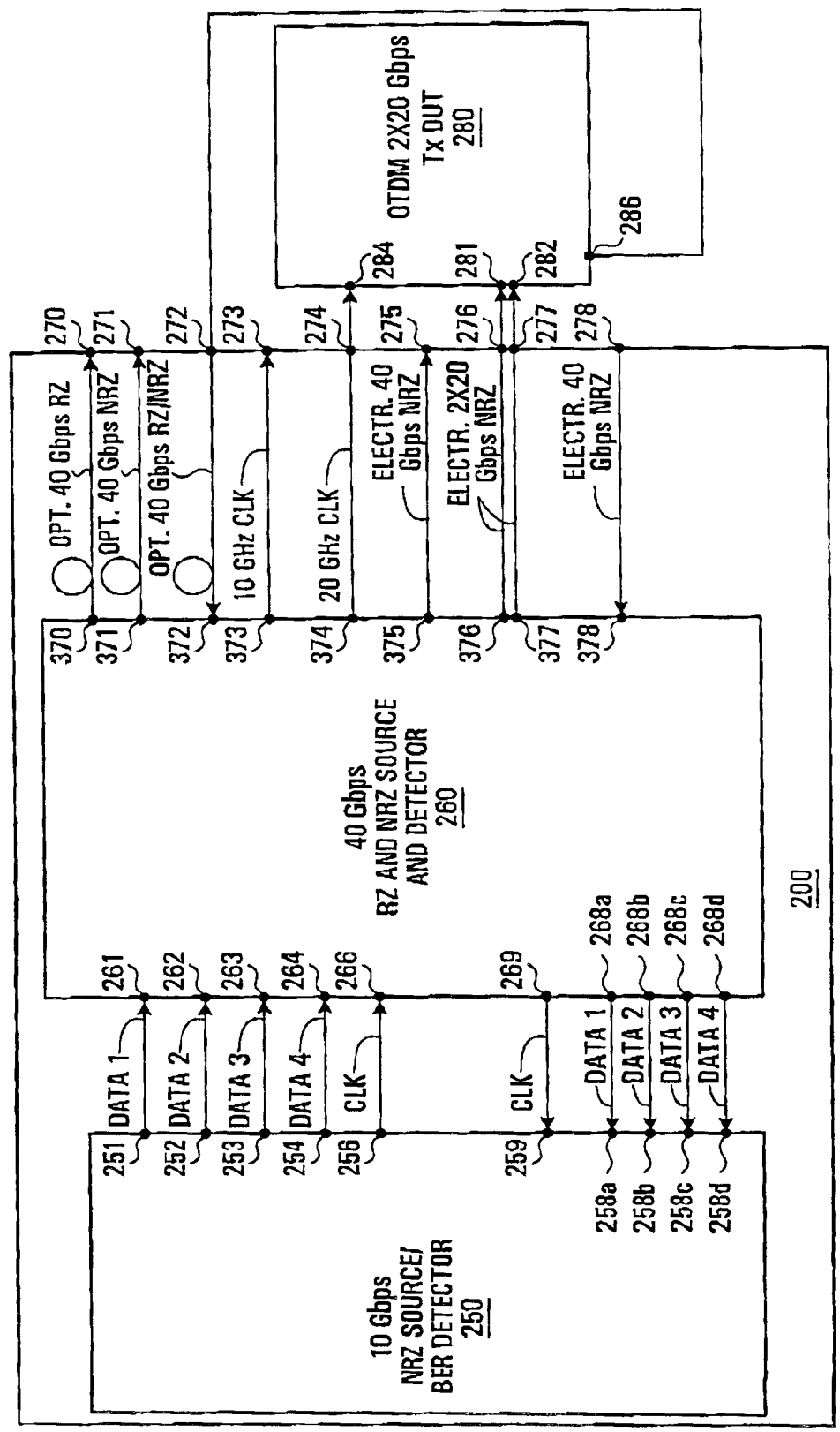
FIG. 2 is a diagram of a BER testing arrangement for testing an OTDM transmitter, the arrangement including an MPBERT constructed according to an embodiment of the invention.

Referring to FIG. 2, an arrangement for testing an optical transmitter having an optical time domain multiplexer is described. In this example, a DUT 280 has the capability to multiplex two electrical 20 Gbps NRZ data stream inputs into one optical 40 Gbps RZ signal output. The 10 Gbps NRZ Source/BER Detector 250 outputs four 10 Gbps PRBS data streams over outputs 251, 252, 253, and 254 and a single clock output 256 to respective data inputs 261, 262, 263, and 264 and the clock input 266 of the 40 Gbps RZ and NRZ Source and Detector 260. The 40 Gbps RZ and NRZ Source and Detector 260 multiplexes these data streams into two electrical 20 Gbps NRZ signals. The DUT 280 is supplied these two electrical 20 Gbps NRZ data streams from outputs 276, and 277, of the MPBERT 200, which are input at inputs 281 and 282 of the DUT 280. The 20 GHz clock output 274 of the MPBERT 200 is connected to a clock input 284 of the DUT 280. Depending on the particular transmitter being tested sometimes the 10 GHz clock output 273 is used. Using the clock signal from the clock output 274, the DUT 280 multiplexes the two electrical 20 Gbps NRZ signals output from outputs 276, and 277 of the MPBERT 200 into a single 40 Gbps optical signal. This single optical signal is output from an optical output 286 of the DUT 280. The optical output 286 of the DUT 280 is connected to the optical input 272 of the MPBERT 200. The signal input to the MPBERT 200 is then demultiplexed through the 40 Gbps RZ and NRZ Source and Detector 260 into four 10 Gbps signals corresponding to the data streams of outputs 251, 252, 253, and 254 of the 10 Gbps Source/BER Detector 250, and are output through data outputs 268a, 268b, 268c, and 268d for bit error rate testing.

Figure 3:
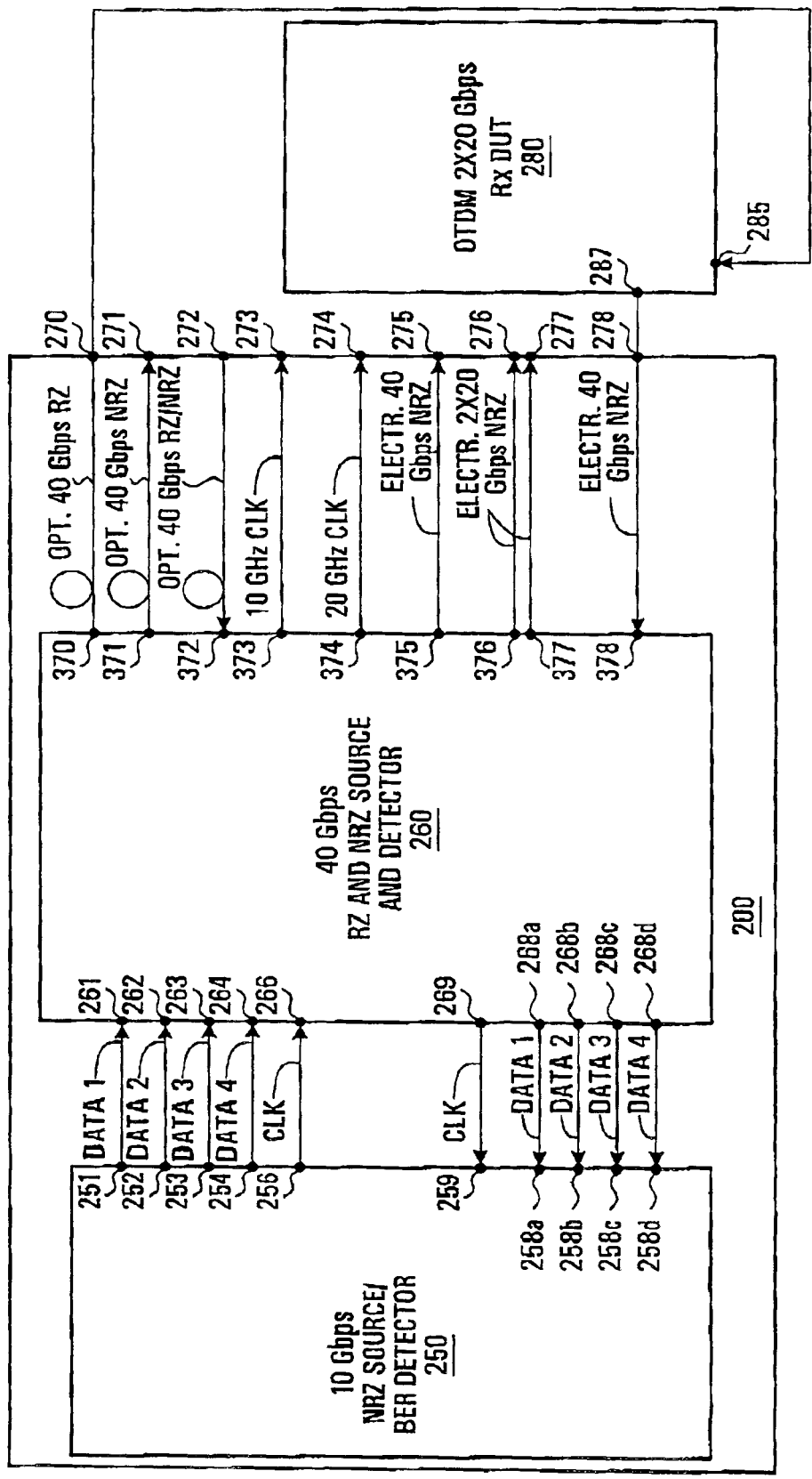
FIG. 3 is a diagram of a BER testing arrangement for testing an OTDM receiver, the arrangement including an MPBERT constructed according to an embodiment of the invention.

Referring to FIG. 3, an arrangement for testing an optical receiver having an optical time domain multiplexer is described. The outputs and inputs between the 10 Gbps NRZ Source/BER Detector 250 and the 40 Gbps RZ and NRZ Source and Detector 260, are connected and used in a similar manner to that described in the arrangement illustrated by FIG. 2. The PRBS data input from the 10 Gbps NRZ Source/BER Detector 250 to the 40 Gbps RZ and NRZ Source and Detector 260, is output as an optical 40 Gbps RZ signal through the optical 40 Gbps RZ output 270 of the MPBERT 200. This signal is provided to an optical input 285 of a DUT 280, An electrical 40 Gbps NRZ output 287 of the DUT 280 is connected to the electrical 40 Gbps NRZ input 278 of the MPBERT 200 respectively. The signal input to the MPBERT 200 is then demultiplexed through the 40 Gbps RZ and NRZ Source and Detector 260 into four 10 Gbps signals corresponding to the data streams output from outputs 251, 252, 253, and 254 of the 10 Gbps Source/BER Detector 260, and is output through data outputs 268a, 268b, 268c, and 268d for bit error rate testing.

Figure 4:
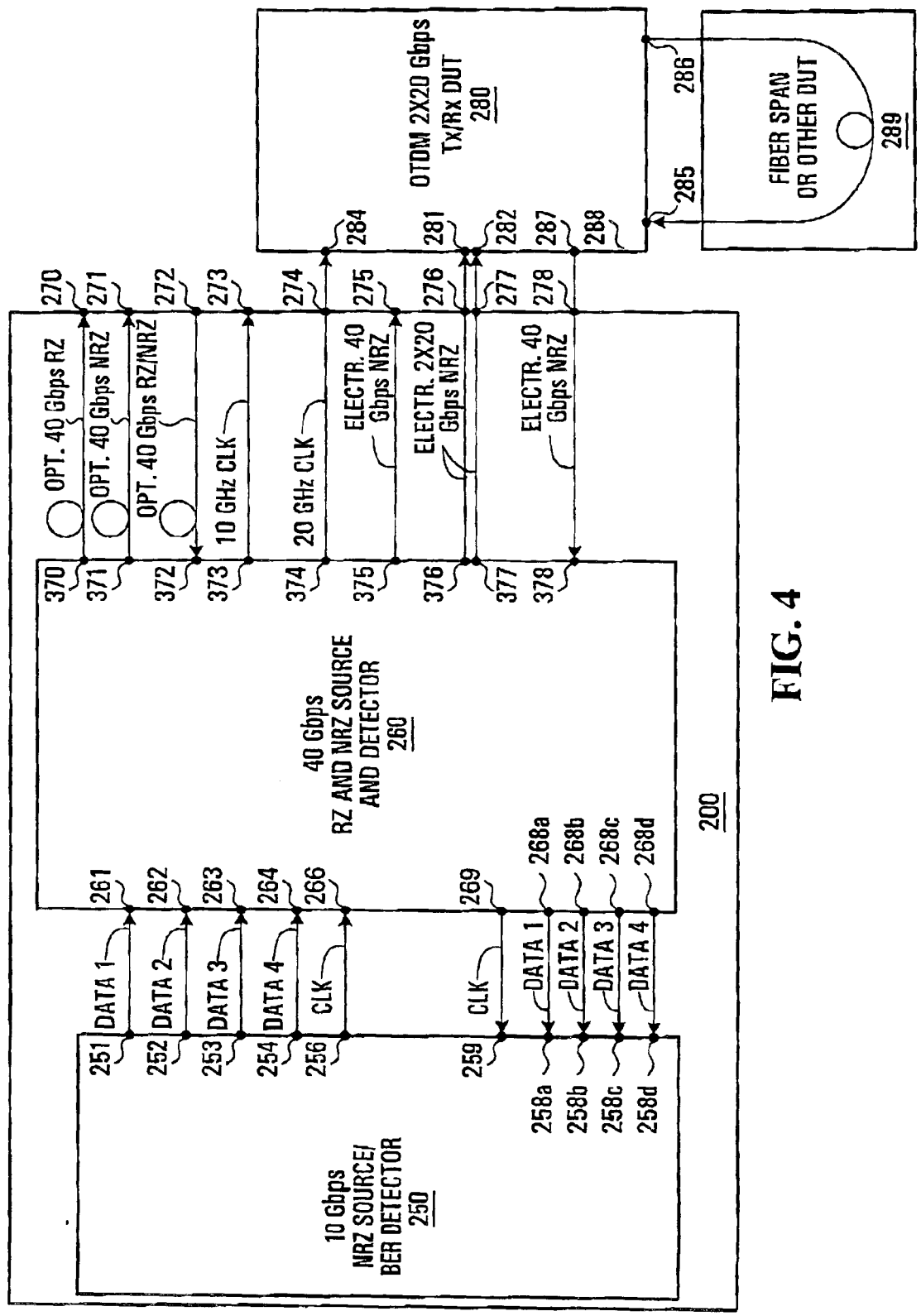
FIG. 4 is a diagram of a BER testing arrangement for testing an OTDM transmitter and receiver, the arrangement including an MPBERT constructed according to an embodiment of the invention.

Referring to FIG. 4, an arrangement for testing an OTDM transmitter and receiver is described. In this example, a DUT 280 has the capability to multiplex two electrical 20 Gbps NRZ signals into one optical 40 Gbps RZ data stream output. The outputs and inputs between the 10 Gbps NRZ Source/BER Detector 250 and the 40 Gbps RZ and NRZ Source and Detector 260, are connected and used in a similar manner to that described in the arrangement illustrated by FIG. 2. The PRBS data input from the 10 Gbps NRZ Source/BER Detector 250 to the 40 Gbps RZ and NRZ Source and Detector 260, is output as two electrical 20 Gbps NRZ signals through the two electrical 20 Gbps NRZ outputs 276, 277 of the MPBERT 200. These signal are provided to electrical inputs 281, and 282 of the DUT 280. The 20 GHz clock 274 of the MPBERT 200 is connected to a clock input 284 of the DUT 280. Depending on the particular transmitter and receiver being tested sometimes the 10 GHz clock output 273 is used. Using the clock signal, the DUT 280 multiplexes the two electrical 20 Gbps NRZ signals output from the MPBERT 200 into a single 40 Gbps optical signal. This optical signal is output from an optical output 286 which is connected to a fiber span or other DUT 289. An electrical 40 Gbps NRZ output 287 of the DUT 280 is connected to the electrical 40 Gbps NRZ input 278 respectively of the MPBERT 200. The signal input at 278 to the MPBERT 200 is then demultiplexed through the 40 Gbps RZ and NRZ Source and Detector 260 into four 10 Gbps signals corresponding to the data streams output from outputs 251, 252, 253, and 254 of the 10 Gbps Source/BER Detector 250, and are output through data outputs 268a, 268b, 268c, and 268d for bit error rate testing.

Figure 5:
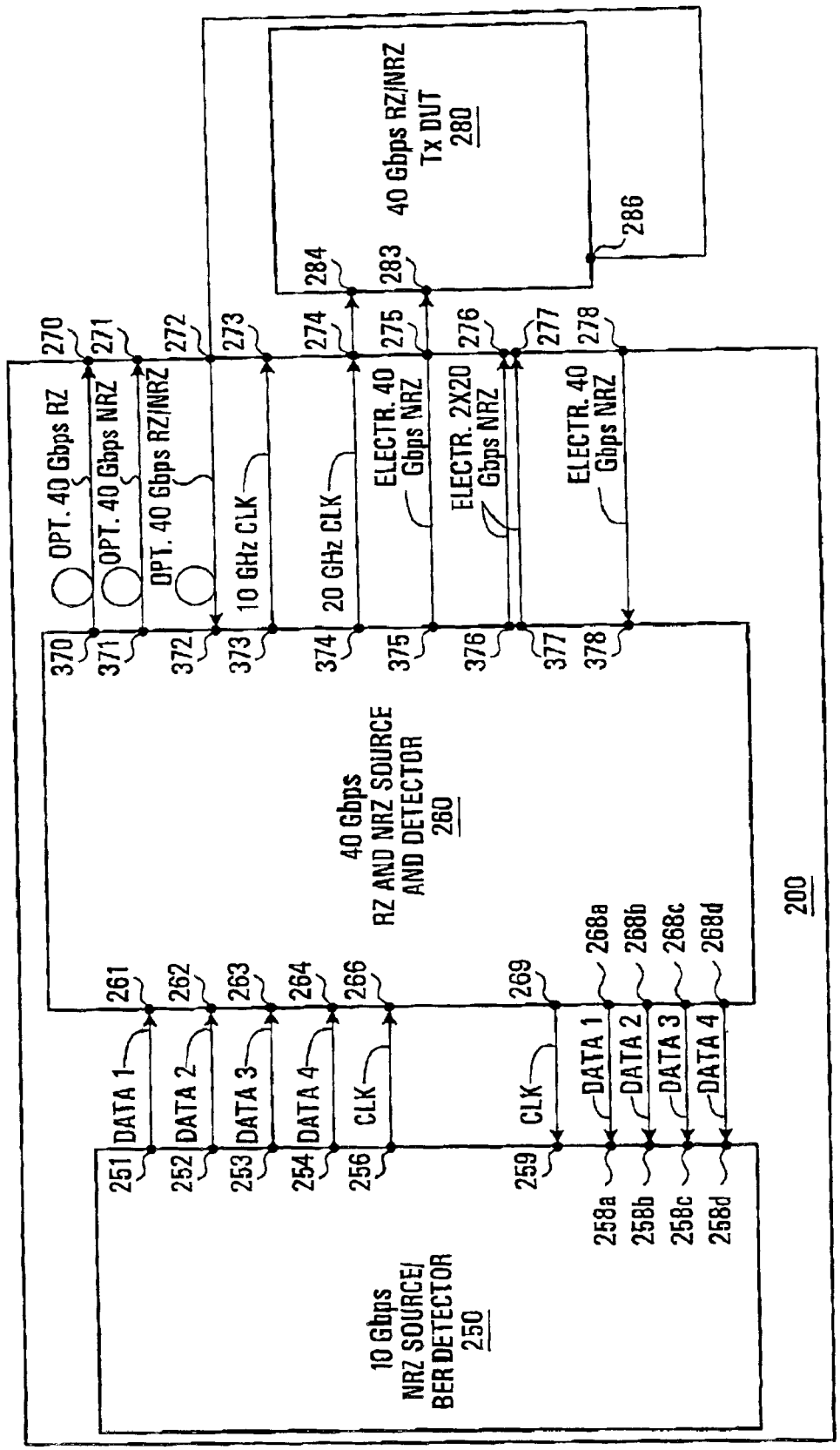
FIG. 5 is a diagram of a BER testing arrangement for testing an optical transmitter not having an OTDM, the arrangement including an MPBERT constructed according to an embodiment of the invention.

Referring to FIG. 5, an arrangement for testing an optical transmitter is described. The outputs and inputs between the 10 Gbps NRZ Source/BER Detector 250 and the 40 Gbps RZ and NRZ Source and Detector 260, are connected and used in a similar manner to that described in the arrangement illustrated by FIG. 2. The PRBS data input from the 10 Gbps NRZ Source/BER Detector 250 to the 40 Gbps RZ and NR2 Source and Detector 260, is output as an electrical 40 Gbps NRZ signal through the electrical 40 Gbps NRZ output 275 of the MPBERT 200. This signal is provided to an electrical 40 Gbps NRZ input 283 of a DUT 280 while a 20 GHz clock is provided from clock output 274 of the MPBERT 200 to a clock input 284 of the DUT 280. Depending on the particular transmitter being tested sometimes the 10 GHz clock output 273 is used. Using the clock signal from the clock output 274, and the electrical 40 Gbps NRZ signal output from the MPBERT 200, the DUT 280 produces a single 40 Gbps optical signal. This optical signal which could be an NRZ or an RZ signal, is output from an optical output 286 of the DUT 280. The optical output 286 of the DUT 200 is connected to the optical 40 Gbps RZ/NRZ input 272 of the MPBERT 200. The signal input to the MPBERT 200 is then demultiplexed through the 40 Gbps RZ and NRZ Source and Detector 260 into four 10 Gbps signals corresponding to the data streams output from outputs 251, 252, 253, and 254 of the 10 Gbps Source/BER Detector 250, and are output through data outputs 268a, 268b, 268c, and 268d for bit error rate testing.

Figure 6:
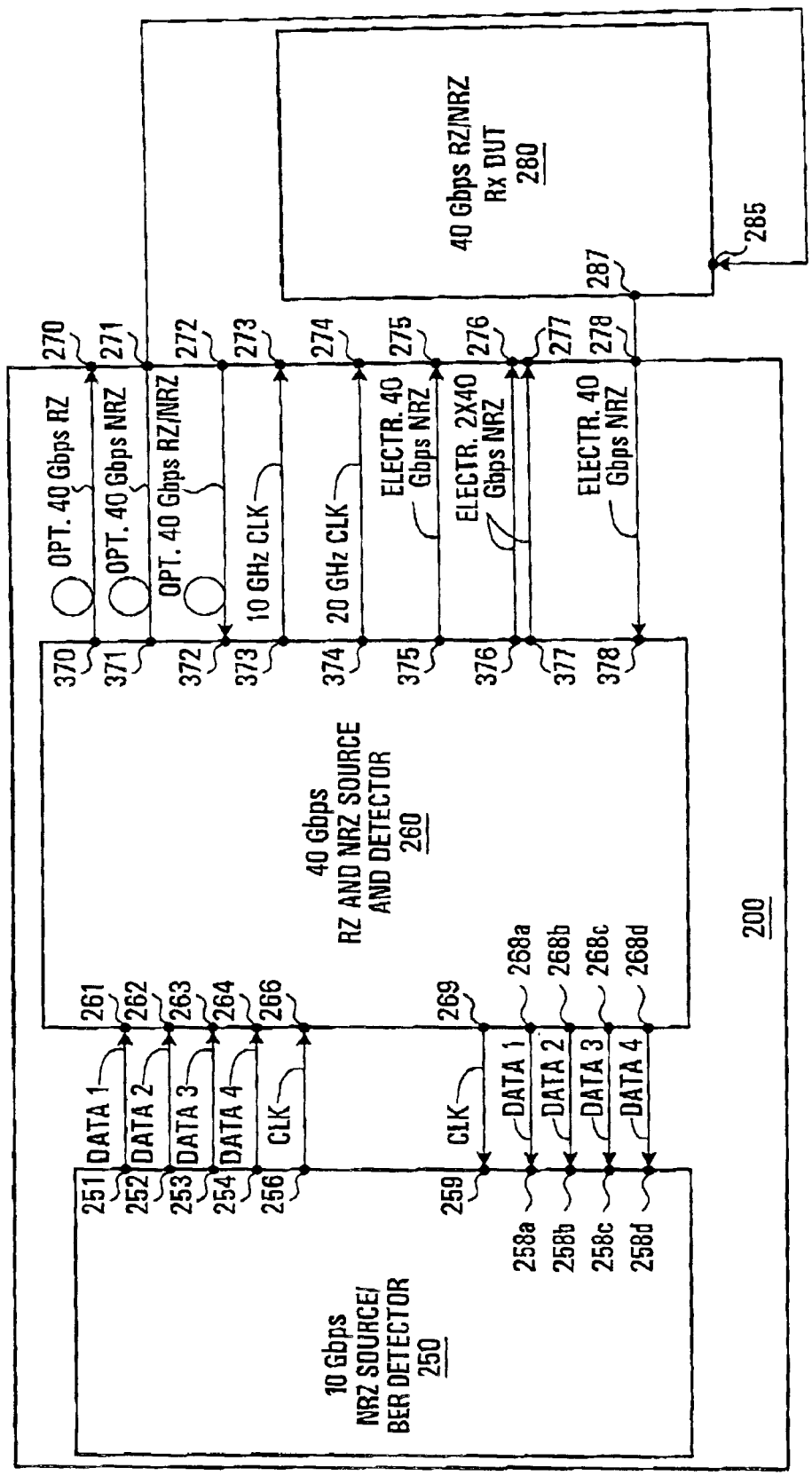
FIG. 6 is a diagram of a BER testing arrangement for testing an optical receiver not having an OTDM, the arrangement including an MPBERT constructed according to an embodiment of the invention.

Referring to FIG. 6, an arrangement for testing an optical receiver is described. The outputs and inputs between the 10 Gbps NRZ Source/BER Detector 250 and the 40 Gbps RZ and NRZ Source and Detector 260, are connected and used in a similar manner to that described in the arrangement illustrated by FIG. 2. The PRBS data input from the 10 Gbps NRZ Source/BER Detector 250 to the 40 Gbps RZ and NRZ Source and Detector 260, is output as an optical 40 Gbps WRZ signal through the optical 40 Gbps NRZ output 271 of the MPBERT 200. This signal is provided to an optical input 285 of a DUT 280. Using the optical 40 Gbps NRZ signal output from the MPBERT 200 the DUT 280 produces a single 40 Gbps NRZ electrical signal at output 287. The signal output from 287 of the DUT 280 is input to the MPBERT 200 at 278 which is then demultiplexed through the 40 Gbps RZ and NRZ Source and Detector 260 into four 10 Gbps signals corresponding to the data streams output from outputs 251, 252, 253, and 254 of the 10 Gbps Source/BER Detector 250, and are output through data outputs 268a, 268b, 268c, and 268d for bit error rate testing.

Figure 7:
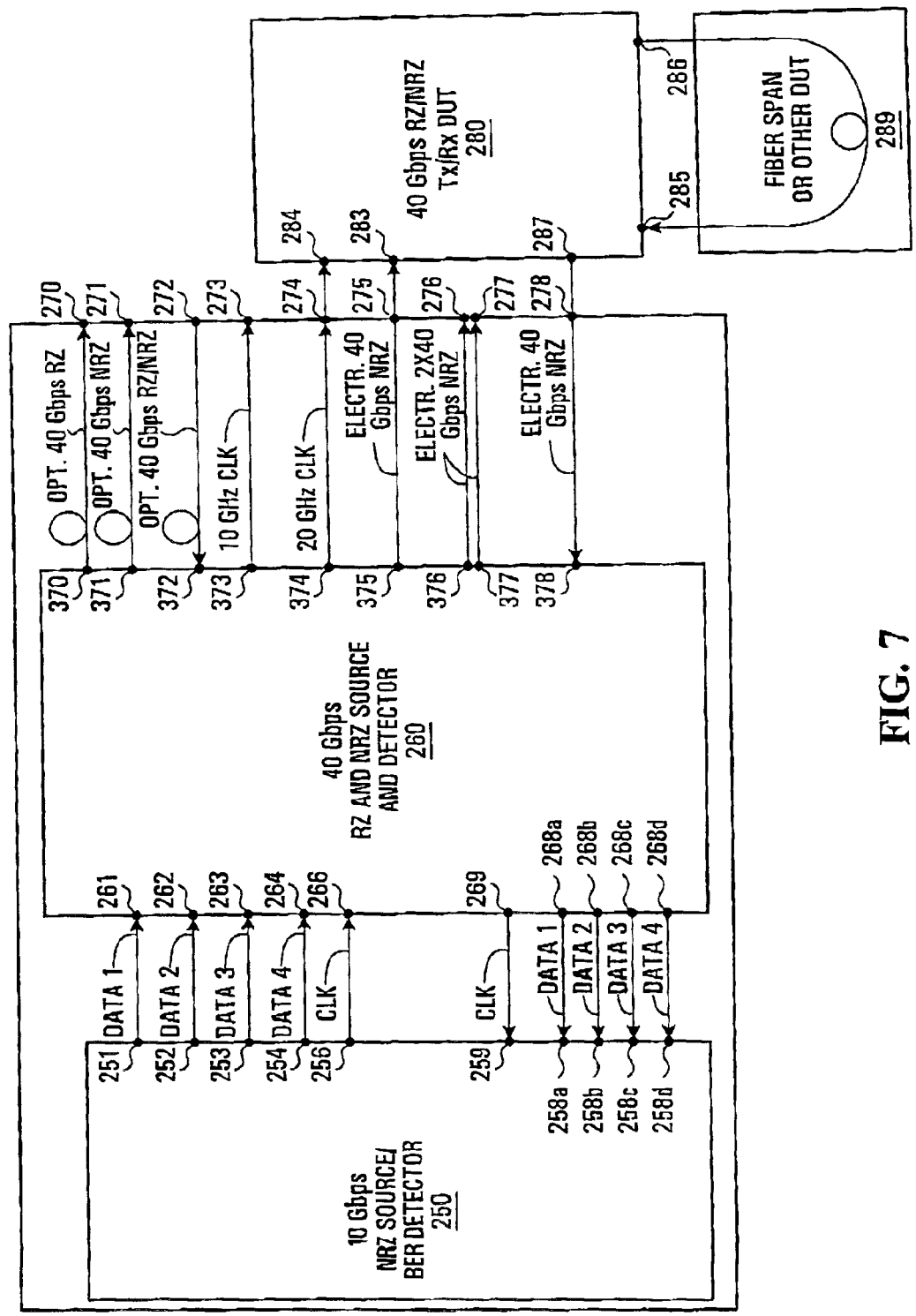
FIG. 7 is a diagram of a BER testing arrangement for testing an optical transmitter and receiver not having an OTDM, the arrangement including an MPBERT constructed according to an embodiment of the invention.

Referring to FIG. 7, an arrangement for testing an optical transmitter and receiver is described. The outputs and inputs between the 10 Gbps NRZ Source/BER Detector 250 and the 40 Gbps RZ and NRZ Source and Detector 260, are connected and used in a similar manner to that described in the arrangement illustrated by FIG. 2. The PRBS data input from the 10 Gbps NRZ Source/BER Detector 250 to the 40 Gbps RZ and NRZ Source and Detector 260, is output as an electrical 40 Gbps NRZ signal through the electrical 40 Gbps NRZ output 275 of the MPBERT 200. This signal is provided to an electrical 40 Gbps NRZ input 283 of a DUT 280 while a 20 GHz clock is provided from clock output 274 of the MPBERT 200 to a clock input 284 of the DUT 280. Using the clock signal from the clock output 274, and the electrical 40 Gbps NRZ signal output from 275 of the MPBERT 200, the DUT 280 produces a 40 Gbps optical signal. This optical signal is output from an optical output 286 which is connected to a fiber span or other DUT 289. An electrical 40 Gbps NRZ output 287 of the DUT 280 is connected to the electrical 40 Gbps NRZ input 278 of the MPBERT 200. The signal input to the MPBERT 200 at input 278 is then demultiplexed through the 40 Gbps RZ and NRZ Source and Detector 260 into four 10 Gbps signal corresponding to the data streams output from outputs 251, 252, 253, and 254 of the 10 Gbps Source/BER Detector 250, and are output through data outputs 268a, 268b, 268c, and 268d for bit error rate testing.

Figure 8:
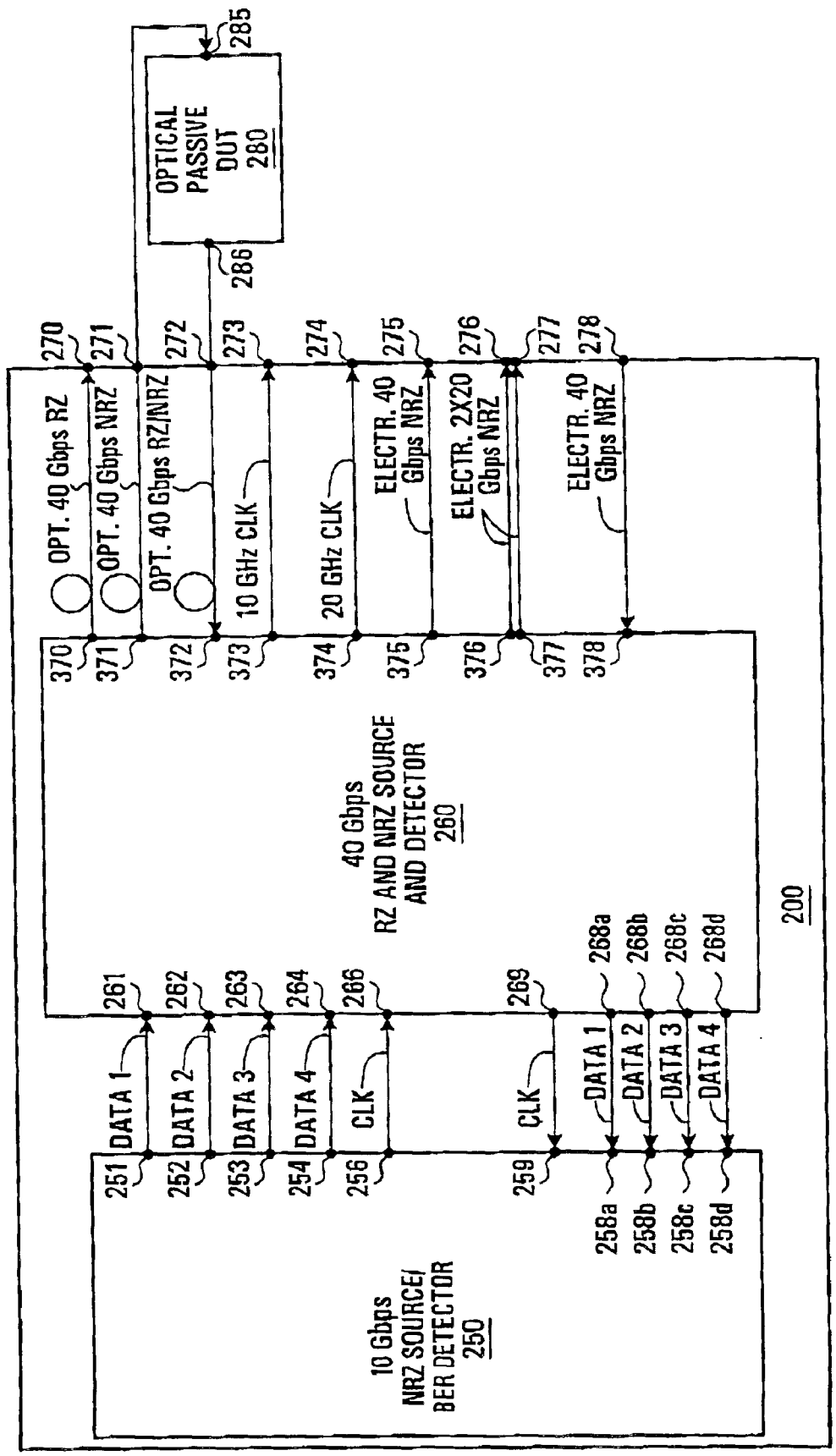
FIG. 8 is a diagram of a BER testing arrangement for testing a passive optical device, the arrangement including an MPBERT constructed according to an embodiment of the invention.

Referring to FIG. 8, an arrangement for testing a passive optical device is described. The outputs and inputs between the 10 Gbps NRZ Source/BER Detector 250 and the 40 Gbps RZ and NRZ Source and Detector 260, are connected and used in a similar manner to that described in the arrangement illustrated by FIG. 2. The PRBS data input from the 10 Gbps NRZ Source/BER Detector 250 to the 40 Gbps RZ and NRZ Source and Detector 260, is output as an optical 40 Gbps NRZ signal through the optical 40 Gbps NRZ output 271 of the MPBERT 200. In alternative arrangements for testing a passive optical device, an optical 40 Gbps RZ signal from the MPBERT 200 optical output 270 may be used. The signal from output 271 is provided to an optical input 285 of a passive optical DUT 280. The signal traverses the device under test 280 and exits at output 286 of the DUT 280. The 40 Gbps NRZ optical signal is input to the MPBERT 200 at optical input 272. The signal input to the MPBERT 200 is then demultiplexed through the 40 Gbps RZ and NRZ Source and Detector 260 into four 10 Gbps signal corresponding to the data streams output from outputs 251, 252, 253, and 254 of the 10 Gbps Source/BER Detector 250, and are output through data outputs 268a, 268b, 268c, and 268d for bit error rate testing.

The following descriptions and their accompanying figures describe the various components of an MPBERT constructed according to an embodiment of the invention. This preferred embodiment corresponds to that which preferably would be used in the BER testing arrangements described above. As such the following describes only a preferred embodiment of the invention constructed to perform at a 40 gigabits per second rate. Other embodiments constructed according to the invention are envisioned which provide higher rate data signals and test components and subsystems of higher data rate specifications for example in the 80 Gbps and 160 Gbps regimes and beyond.

With reference to FIGS. 9, 10, 11, 12, 13, and 14, an MPBERT 200 constructed according to an embodiment of the invention, is described.

Figure 9:
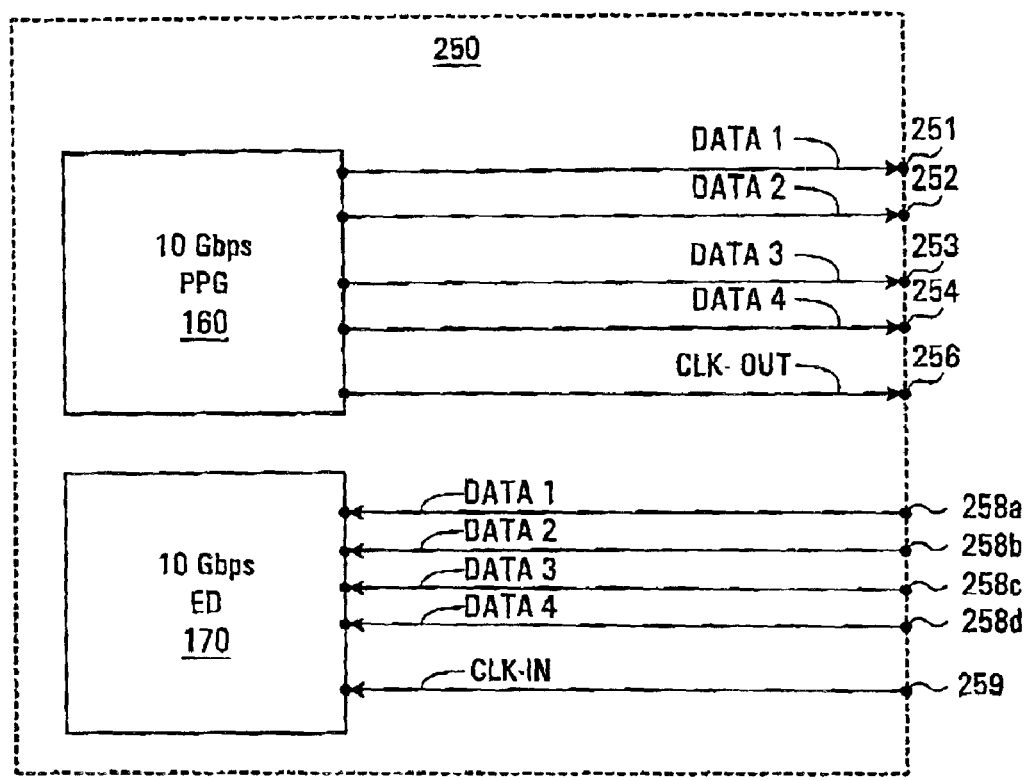
FIG. 9 is a diagram of a 10 Gbps NRZ Source/BER Detector which is a subset of components of an MPBERT constructed according to an embodiment of the invention.

Referring to FIG. 9, the 10 Gbps NRZ Source/BER Detector 250 and its operation according to the invention is described. The 10 Gbps NRZ Source/BER Detector 250 has a PPG 160 which outputs four 10 Gbps PRBS signals; Data 1, Data 2, Data 3, and Data 4 through outputs 251, 252, 253, and 254 respectively of the 10 Gbps NRZ Source/BER Detector 250. The PPG 160 outputs a 10 GHz clock signal through output 256 of the 10 Gbps Source/BER Detector 250. The 10 Gbps NRZ Source/BER Detector 250 has a 10 Gbps ED 170 which has four data inputs, and a clock input connected respectively to the data inputs 258a, 258b, 258c, and 258d, and the clock input 259 of the 10 Gbps Source/BER Detector 250. In this embodiment the data streams input to the 10 Gbps Source/BER Detector 250 at 258a, 258b, 258c, and 258d should correspond to the output signals from the 10 Gbps PPG 160, namely Data 1, Data 2, Data 3, and Data 4. The 10 Gbps ED 170 has its own pattern generator which can produce an exact replica of the known test patterns produced by the PPG 160, and also has a comparator. The comparator of the 10 Gbps ED 170 checks every bit received at the inputs 258a, 258b, 258c, and 258d of the 10 Gbps Source/BER Detector 250 against the known patterns internally generated by the pattern generator of the ED 170. Each time a received bit differs from the known transmitted bit an error is logged. Functioning as the source of the PRBS data streams and the error detector of the recovered data stream, the 10 Gbps NRZ Source/BER Detector 250 is the first and last location for the data streams used for testing by the MPBERT 200.

Figure 10:
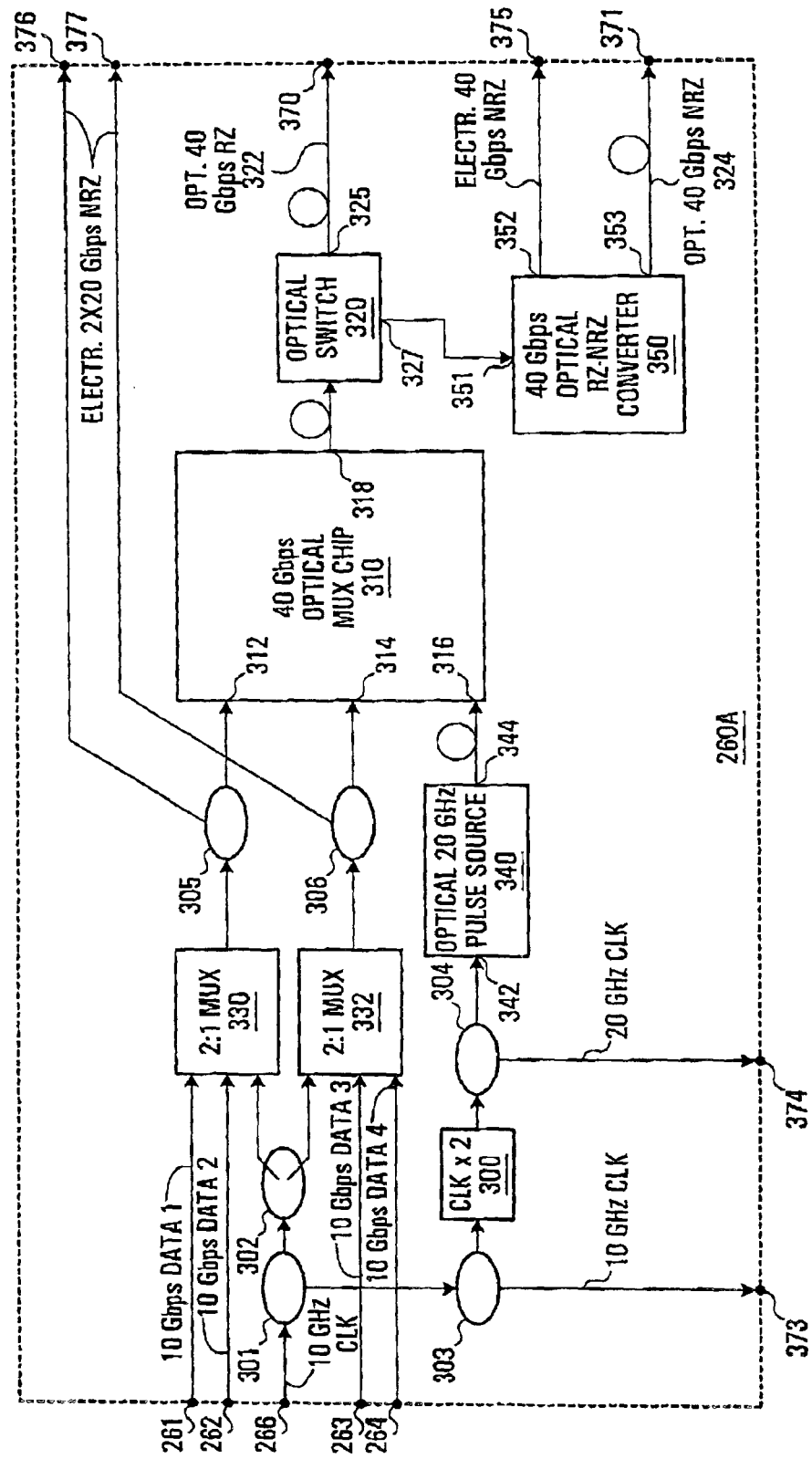
FIG. 10 is a diagram of a 40 Gbps RZ and NRZ Source which is a subset of components of an MPBERT constructed according to an embodiment of the invention.

Referring to FIG. 10, a 40 Gbps RZ and NRZ Source 260A and its operation according to the invention is described. The 40 Gbps RZ and NRZ Source 260A, provides source functionality to the 40 Gbps RZ and NRZ Source and Detector 260 and is not a separate apparatus but a grouped subset of components thereof. Therefore, all numbered outputs and inputs of the 40 Gbps RZ and NRZ Source 260A are the same inputs and outputs as those correspondingly numbered for the 40 Gbps RZ and NRZ Source and Detector 260. The 40 Gbps RZ and NRZ Source 260A has data inputs 261, 262, 263, and 264 connected to data outputs 261, 262, 263, and 264 respectively of the 10 Gbps Source/BER Detector 250. The 10 GHz clock input 266 of the 40 Gbps RZ and NRZ Source 260A is connected to the 10 GHz clock output 256 of the 10 Gbps Source/BER Detector 250. The 10 GHz clock signal input through 266 is split at a first splitter 301. A first output of the first splitter 301 is connected to a second splitter 302. The second splitter 302 outputs a first clock signal to a clock input of a first 2:1 multiplexer (MUX) 330, and outputs a second clock signal to a clock input of a second 2:1 multiplexer (MUX) 332. The first 2:1 MUX 330 receives as data inputs, the 10 Gbps signals input at data inputs 261, and 262 of the 40 Gbps RZ and NRZ Source 260A, corresponding to data streams Data 1 and Data 2 respectively. The second 2:1 MUX 332 receives as data inputs, the 10 Gbps signals input at data inputs 263, and 264 of the 40 Gbps RZ and NRZ Source 260A, corresponding to data streams Data 3 and Data 4 respectively. Both the first 2:1 MUX 330 and the second 2:1 MUX 332 use the clock input it receives from splitter 302 to multiplex the two 10

Gbps signals input to each of them, into a respective 20 Gbps multiplexed signal. The first 2:1 MUX 330 outputs a 20 Gbps multiplexed signal to a third splitter 305, while the second 2:1 MUX 332 outputs a 20 Gbps multiplexed signal to a fourth splitter 306. A first output of the third splitter 305 is connected to the electrical 20 Gbps NRZ output 376 of the 40 Gbps RZ and NRZ Source 260A. A first output of the fourth splitter 306 is connected to the electrical 20 Gbps NRZ output 377 of the 40 Gbps RZ and NRZ Source 260A. These two outputs 376 and 377 of the 40 Gbps RZ and NRZ Source 260A are connected to outputs 276 and 277 respectively of the MPBERT 200 for injection into a device under test. The output signal at output 376 is a multiplexed signal comprising Data 1 and Data 2, and the output signal at output 377 is multiplexed signal comprising Data 3 and Data 4. A second output from the third splitter 305 is connected to a first data input 312 of a 40 Gbps Optical MUX Chip 310. A second output from the fourth splitter 306 is connected to a second data input 314 of the 40 Gbps Optical MUX Chip 310. An optical input 316 of the 40 Gbps Optical MUX Chip 310 is connected to an output 344 of an Optical 20 GHz Pulse Source 340. The Optical 20 GHz Pulse Source 340 could for example be a mode-locking laser, or CW laser combined with a pulse generating modulator. The first splitter 301 which receives as input the 10 GHz clock signal from input 266 has a second output which is connected to a fifth splitter 303. The fifth splitter 303 has a first output which is connected to a 2× clock multiplier 300. The clock multiplier doubles the 10 GHz clock signal and outputs a 20 GHz clock signal to a sixth splitter 304. The sixth splitter 304 has a first output which is connected to the clock input 342 of the Optical 20 GHz Pulse Source 340. Using the optical 20 GHz pulse input to 316, and the 20 Gbps NRZ data streams input to 312, and 314, the 40 Gbps Optical MUX Chip 310 creates a multiplexed 40 Gbps optical RZ signal comprising Data 1, Data 2, Data 3, and Data 4 at its output 318. The output of the 40 Gbps Optical MUX Chip 318 is connected to a first optical switch 320, switchable between a first output 325, and a second output 327. The first output 325 of the first optical switch 320 is connected to an optical waveguide 322 which is connected to the optical 40 Gbps RZ output 370 of the of the optical 40 Gbps RZ and NRZ Source 260A. Output 370 is connected to the optical 40 Gbps RZ output 270 of the MPBERT 200. If optical switch 320 is switched to output 325, a signal from the optical 40 Gbps RZ output 270 is provided for injection into an optical device under test. The second output 327 of the first optical switch 320 is connected to an input 351 of a 40 Gbps optical RZ-NRZ Converter 350. The 40 Gbps optical RZ-NRZ Converter 350 outputs an electrical 40 Gbps NRZ signal at output 352, and an optical 40 Gbps NRZ signal at output 353. Output 352 of the 40 Gbps optical RZ-NRZ Converter 350 is connected to the electrical 40 Gbps NRZ output 375 of the 40 Gbps RZ and NRZ Source 260A. The electrical 40 Gbps NRZ output 375 is connected to the electrical 40 Gbps NRZ output 275 of the MPBERT 200. If the first optical switch 320 is switched to output 327, a signal from the electrical 40 Gbps NRZ output 275 is provided for injection into a device under test. Output 353 of the 40 Gbps optical RZ-NRZ Converter 350 is connected to an optical waveguide 324 which is connected to the optical 40 Gbps NRZ output 371 of the 40 Gbps RZ and NRZ Source 260A. The optical 40 Gbps NRZ output 371 is connected to the optical 40 Gbps NRZ output 271 of the MPBERT 200. If the first optical switch 320 is switched to output 327, a signal from the optical 40 Gbps NRZ output 271 is provided for injection into a device under test. The second output of the fifth splitter 303 is connected to the 10 GHz clock output 373 of the 40 Gbps RZ and NRZ Source 260A. The 10 GHz clock output 373 is connected to the 10 GHz clock output 273 of the MPBERT 200 and is provided as a 10 GHz clock signal for a device under test. The second output of the sixth splitter 304 is connected to the 20 GHz clock output 374 of the 40 Gbps RZ and NRZ Source 260A. The 20 GHz clock output 374 is connected to the 20 GHz clock output 274 of the MPBERT 200 and is provided as a 20 GHz clock signal for a device under test.

Figure 11:
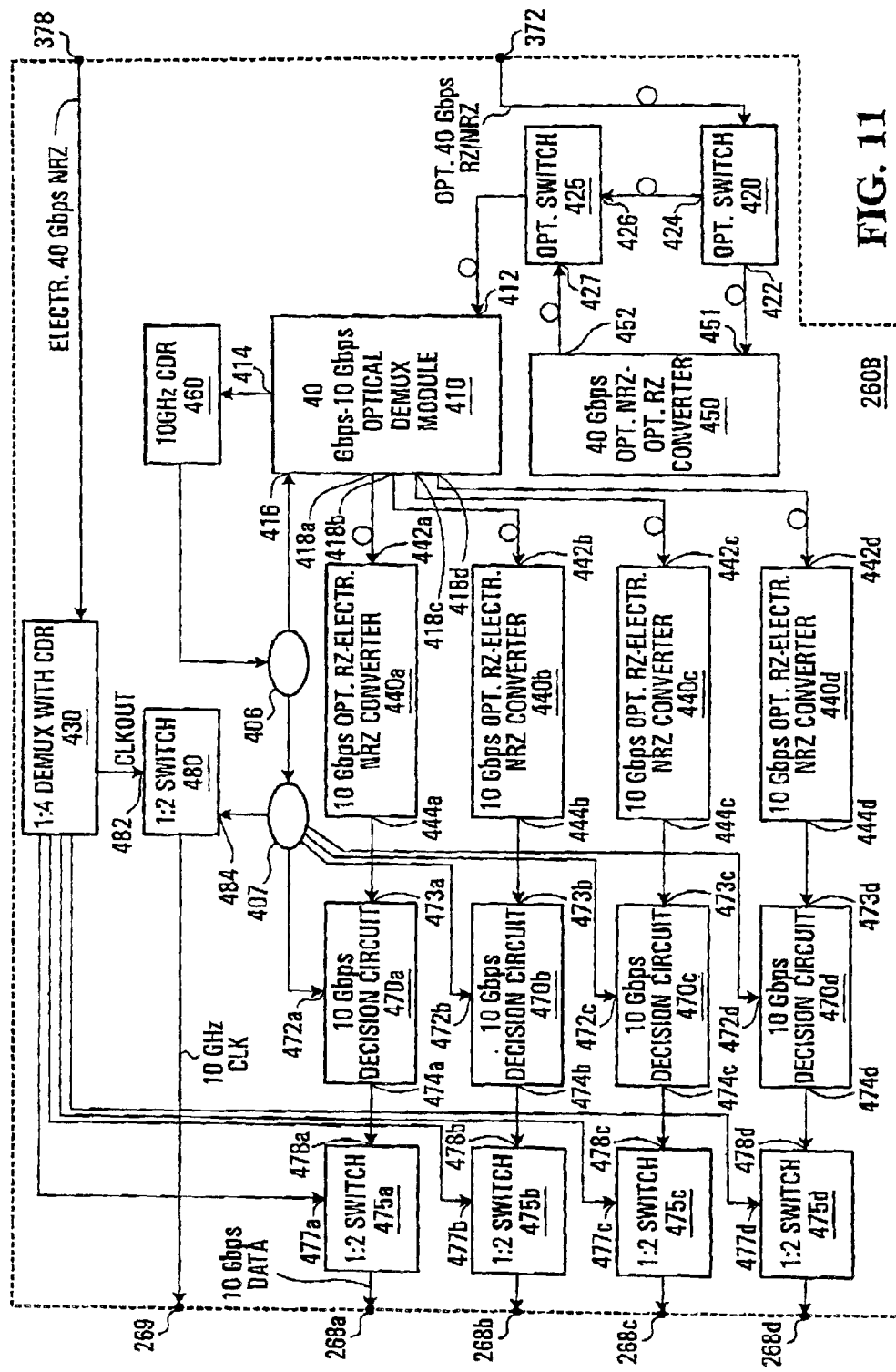
FIG. 11 is a diagram of a 40 Gbps RZ and NRZ Detector which is a subset of components of an MPBERT constructed according to an embodiment of the invention.

Referring to FIG. 11, a 40 Gbps RZ and NRZ Detector 260B and its operation according to the invention is described. The 40 Gbps RZ and NRZ Detector 260B, provides signal detection functionality to the 40 Gbps RZ and NRZ Source and Detector 260 and is not a separate apparatus but a grouped subset of components thereof. Therefore, all numbered outputs and inputs of the 40 Gbps RZ and NRZ Detector 260B are the same inputs and outputs as those correspondingly numbered for the 40 Gbps RZ and NRZ Source and Detector 260. The 40 Gbps RZ and NRZ Detector 260B has four 10 Gbps data outputs 268a, 268b, 268c, and 268d connected to data inputs 258a, 258b, 258c, and 258d of the 10 Gbps Source/BER Detector 250. A 10 GHz clock output 269 of the 40 Gbps RZ and NRZ Detector 260B is connected to the 10 GHz clock input 259 of the 10 Gbps Source/BER Detector 250. The optical 40 Gbps RZ/NRZ input 272 of the MPBERT 200 is connected to the optical 40 Gbps RZ/NRZ input 372 of the 40 Gbps RZ and NRZ Detector 260B. Input 372 of the 40 Gbps RZ and NRZ Detector 260B is connected to a second optical switch 420. The second optical switch 420 is connected by a first output 422 to an input 451 of a 40 Gbps optical NRZ-RZ Converter 450. A second output 424 of the second optical switch 420 is connected to a first input 426 of a third optical switch 425. An output 452 of the 40 Gbps optical NRZ-RZ Converter 450 is connected to a second input 427 of the third optical switch 425. If the second optical switch 420 is set to its first output 424, and if the third optical switch 425 is set to its first input 426, then the optical signal entering input 372 traverses the second optical switch 420, the third optical switch 425, and is input to a first input 412 of a 40 Gbps–10 Gbps Optical Demultiplexer (DEMUX) Module 410. The optical switches can be set in this manner when the optical signal input at 372 of the 40 Gbps RZ and NRZ Detector 260B is an RZ signal and use of the 40 Gbps optical NRZ-RZ Converter 450 is not desired. When the optical signal input at 372 of the 40 Gbps RZ and NRZ Detector 260B is an NRZ signal and use of the 40 Gbps optical NRZ-RZ Converter 450 is desired, the second optical switch 420 may be set to its second output 422, while the third optical switch 425 may be set to its second input 427. In this case the optical signal entering input 372 traverses the second optical switch 420, and is routed to the input 451 of the 40 Gbps optical NRZ-RZ Converter 450 in which the 40 Gbps optical NRZ signal is converted to a 40 Gbps optical RZ signal, which is output from 452, traverses the third optical switch 425 and enters input 412 of the 40 Gbps–10 Gbps Optical DEMUX Module 410. An output 414 of the 40 Gbps–10 Gbps Optical DEMUX Module 410 is connected to a 10 GHz Clock Data Recovery (CDR) Unit 460. The recovered clock output of the 10 GHz CDR 460 is connected to a seventh splitter 406. The seventh splitter 406 has a first output connected to a clock input 416 of the 40 Gbps–10 Gbps Optical DEMUX Module 410. Four demuxed data outputs 418a, 418b, 418c, and 418d of the 40 Gbps–10 Gbps Optical DEMUX Module 410 are connected respectively to inputs 442a, 442b, 442c, and 442d of four 10 Gbps optical RZ-electrical NRZ converters 440*a*, 440*b*, 440*c*, and 440*d*. The clock signal recovered by the 10 Ghz CDR 460, input at the clock input 416 of the 40 Gbps–10 Gbps Optical DEMUX Module 410, is used to demultiplex the 40 Gbps optical signal input at 412 into four demultiplexed data channels, output respectively at data outputs 418*a*, 418*b*, 418*c*, and 418*d* of the 40 Gbps–10 Gbps Optical DEMUX Module 410 as optical RZ signals. Four 10 Gbps optical RZ-electrical NRZ converters 440*a*, 440*b*, 440*c*, and 440*d* convert the respective optical RZ signals at inputs 442*a*, 442*b*, 442*c*, and 442*d* into four electrical NRZ signals at their respective outputs 444*a*, 444*b*, 444*c*, and 444*d*. Outputs 444*a*, 444*b*, 444*c*, and 444*d* of respective 10 Gbps optical RZ-electrical NRZ Converters 440*a*, 440*b*, 440*c*, and 440*d* are connected to respective data inputs 473*a*, 473*b*, 473*c*, and 473*d* of four 10 Gbps Decision circuits, respectively 470*a*, 470*b*, 470*c*, and 470*d*. A second output of the seventh splitter 406 is connected to an eighth splitter 407. The eighth splitter 407 has a first, a second, a third, and a fourth output connected respectively to clock inputs 472*a*, 472*b*, 472*c*, and 472*d* of respectively, the four 10 Gbps Decision Circuits 470*a*, 470*b*, 470*c*, and 470*a*. Using the clock input signals from the clock inputs 472*a*, 472*b*, 472*c*, and 472*d*, the respective decision circuits 470*a*, 470*b*, 470*c*, and 470*d* algorithmically assess each bit input to respective data inputs 473*a*, 473*b*, 473*c*, and 473*d* and decide whether each is a one or a zero. The results of the decision circuits 470*a*, 470*b*, 470*c*, and 470*d* are output at respective data outputs 474*a*, 474*b*, 474*c*, and 474*d* of the respective decision circuits 470*a*, 460*b*, 470*c*, and 470*d*. The outputs 474*a*, 474*b*, 474*c*, and 474*d* of the respective decision circuits 470*a*, 470*b*, 470*c*, and 470*d* are connected to first inputs 478*a*, 478*b*, 478*c*, and 478*d* respectively of a first, a second, a third, and a fourth electrical 1:2 switch 475*a*, 475*b*, 475*c*, and 475*d* respectively. The first, second, third, and fourth electrical 1:2 switches 475*a*, 475*b*, 475*c*, and 475*d* have each a respective second input 477*a*, 477*b*, 477*c*, and 477*d*. Outputs of each of the first, second, third, and fourth electrical 1:2 switches 475*a*, 475*b*, 475*c*, and 475*d* are connected to respective data outputs 268*a*, 268*b*, 268*c*, and 268*d* of the 40 Gbps RZ and NRZ Detector 260B. If the first, second, third, and fourth electrical 1:2 switches 475*a*, 475*b*, 475*c*, and 475*d* are set to their respective first inputs 478*a*, 478*b*, 478*c*, and 478*d*, then four data signals corresponding to the four demultiplexed data channels which together made up the optical 40 Gbps RZ/NRZ signal input at 372 of the 40 Gbps RZ and NRZ Detector 260B are sent respectively through outputs 268*a*, 268*b*, 268*c*, and 268*d* of the 40 Gbps RZ and NRZ Detector 260B. The electrical 40 Gbps NRZ input 278 of the MPBERT 200, is connected to an electrical 40 Gbps NRZ input 378 of the 40 Gbps RZ and NRZ Detector 260B. Input 378 of the 40 Gbps RZ and NRZ Detector 260B is connected to a data input of an electrical 1:4 demultiplexer with CDR (Clock Data Recovery) 430, whose four demultiplexed outputs are connected to respective second inputs 477*a*, 477*b*, 477*c*, and 477*d*, of the respective first, second, third, and fourth electrical 1:2 switches 475*a*, 475*b*, 475*c*, and 475*d*. The 1:4 demultiplexer with CDR 430 has a recovered clock output connected to a first input 482 of a fifth electrical 1:2 switch 480. If the first, second, third, and fourth electrical 1:2 switches 475*a*, 475*b*, 475*c*, and 475*d* are set to accept data input from their respective second inputs 477*a*, 477*b*, 477*c*, and 477*d* then four data streams corresponding to four demultiplexed data channels which together make up the original input at 378 of the 40 Gbps RZ and NRZ Detector 260B are output respectively to outputs 268*a*, 268*b*, 268*c*, and 268*d*. The eighth splitter 407 has a fifth output connected to a second input 484 of the fifth electrical 1:2 switch 480. The fifth electrical 1:2 switch 480 has an output connected to the clock output 269 of the 40 Gbps RZ and NRZ Detector 260B. The fifth electrical 1:2 switch 480 may be set to allow the clock input from 482 which was recovered from the signal input at 378 of the 40 Gbps RZ and NRZ Detector 260A to pass to output 269. This will generally be done in association with setting the first, second, third, and fourth electrical 1:2 switches 475*a*, 475*b*, 475*c*, and 475*d* to their second respective inputs 477*a*, 477*b*, 477*c*, and 477*d*. The result therefor would be output of four demultiplexed electrical signals through 268*a*, 268*b*, 268*c*, and 268*d*, and output of the clock signal associated with those data signals through clock signal output 269. The fifth electrical 1:2 switch 480 may be set to allow the clock input from 484, which was recovered from a data stream by the CDR 460, to pass to output 269. This will generally be done in association with setting the first, second, third, and fourth electrical 1:2 switches 475*a*, 475*b*, 475*c*, and 475*d* to their first respective inputs 478*a*, 478*b*, 478*c*, and 478*d*. The result therefor would be output of four demultiplexed signals corresponding to the channels which together make up the optical input at 372 through 268*a*, 268*b*, 268*c*, and 268*d*, and output of the clock signal associated with those data signals through clock signal output 269.

Figure 12:
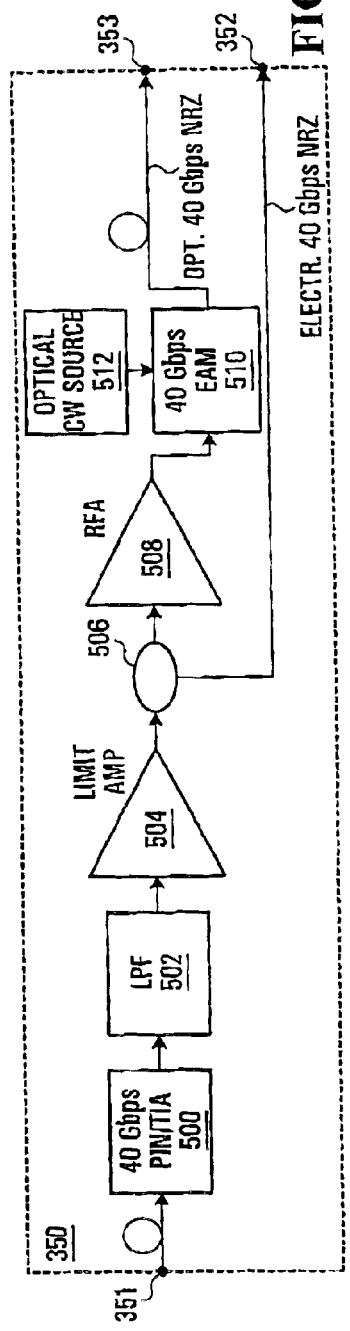
FIG. 12 is diagram of a 40 Gbps Optical RZ-NRZ Converter which is a subset of components of an MPBERT constructed according to an embodiment of the invention.

Referring to FIG. 12, the 40 Gbps optical RZ-NRZ Converter 350 and its operation according to the invention is described. The 40 Gbps optical RZ-NRZ Converter 350, provides conversion of a 40 Gbps optical RZ signal input at 351 to both an optical 40 Gbps NRZ signal output at 353 and an electrical 40 Gbps NRZ signal output at 352. The data signal to be converted is input at input 351 which is connected to a first 40 Gbps PIN Photodiode/Transimpedance Amplifier (PIN/TIA) 500, which directly converts an optical RZ signal into an electrical RZ signal which is output to a first low pass filter (LPF) 502. The first low pass filter 502 operates to smooth and reshape the signal by removing high frequencies. The first LPF 502 has an output connected to a first limit amplifier 504 which operates to remove unwanted transient fluctuations from is the signal by suppressing ripples at "1" levels. The first low pass filter 502, and the first limit amplifier 504, together operate to convert an electric RZ signal into an electrical NRZ signal. The first limit amplifier 504 has an output connected to a ninth splitter 506. The ninth splitter 506 has a first output connected to a first RF amplifier (RFA) 508, and a second output connected to the electrical 40 Gbps NRZ output 352 of the 40 Gbps optical RZ-NRZ Converter 350. An output of the first RFA 508 is connected to a first 40 Gbps Electro-absorption Modulator (EAM) 510. A continuous wave optical source 512 provides a continuous optical signal to the first 40 Gbps EAM 510. The first 40 Gbps EAM 510 modulates the optical signal using the electrical signal input from the first RFA 508. The first 40 Gbps EAM 510 outputs an optical 40 Gbps NRZ signal to output 353 of the 40 Gbps optical RZ-NRZ converter 350.

Figure 13:
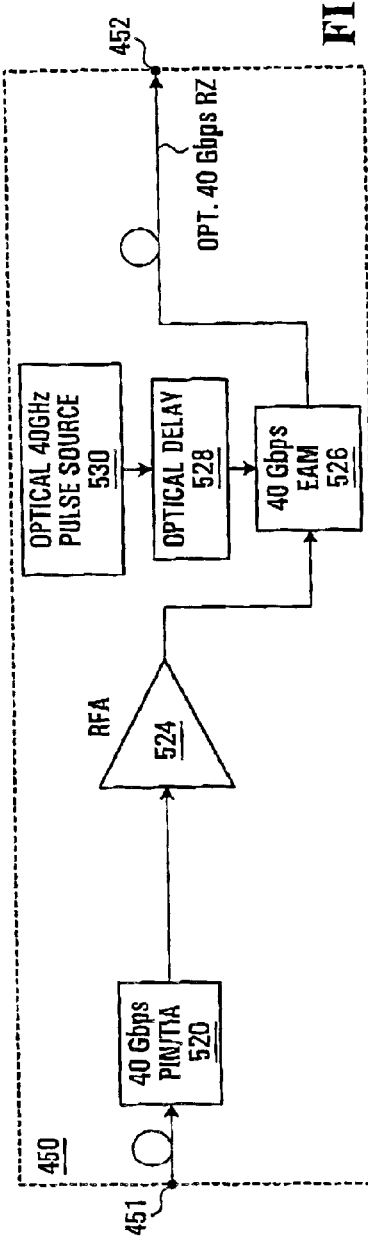
FIG. 13 is a diagram of a 40 Gbps Optical NRZ-RZ Converter which is a subset of components of an MPBERT constructed according to an embodiment of the invention.

Referring to FIG. 13, the 40 Gbps optical NRZ-RZ Converter 450 and its operation according to the invention is described. The 40 Gbps optical NRZ-RZ Converter 450, provides conversion of a 40 Gbps optical NRZ signal to an optical 40 Gbps RZ signal which is output at 452. The data signal to be converted is input at input 451 which is connected to a second 40 Gbps PIN/TIA 520, which directly converts an optical signal into an electrical signal which is output to a second RFA 524. The second RFA 524 has an output connected to a second 40 Gbps EAM 526. An optical 40 GHz pulse source 530 provides a 40 GHz pulse optical signal which passes through an optical delay means 528 to synchronize the optical pulses from the pulse source 530 with each bit in the data signal coming from the second RFA 524, to the second 40 Gbps EAM 526. The second 40 Gbps EAM 526 modulates the optical pulse signal using the electrical signal input from the second RFA 524. The second 40 Gbps EAM 526 outputs an optical 40 Gbps RZ signal to output 452 of the 40 Gbps optical RZ-RZ Converter 450.

Figure 14:
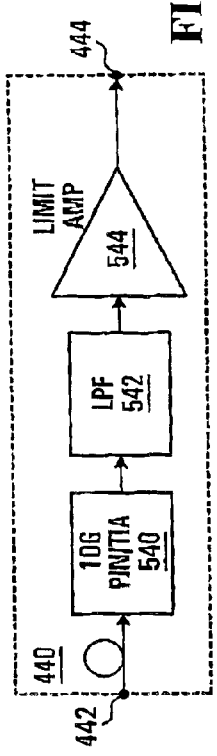
FIG. 14 is a diagram of a 10 Gbps Optical RZ-Electrical NRZ Converter which is a subset of components of an MPBERT constructed according to an embodiment of the invention.

Referring to FIG. 14, a 10 Gbps optical RZ-electrical NRZ Converter 440 and its operation according to the invention is described. It is to be understood that this description of a 10 Gbps optical RZ-electrical NRZ Converter 440 with input 442 and output 444 applies as a description of the four 10 Gbps optical RZ-electrical NRZ Converters 440a, 440b, 440c, and 440d with respective inputs 442a, 442b, 442c, and 442d and respective outputs 444a, 444b, 444c, and 444d of FIG. 11. The 10 Gbps optical RZ-electrical NRZ converter 440, provides conversion of a 10 Gbps optical RZ signal to an electrical 10 Gbps NRZ signal output at 444. The data signal to be converted is input at input 442 which is connected to a first 10 Gbps PIN/TIA 540, which directly converts an optical signal into an electrical signal which is output to a second low pass filter (LPF) 542. The second low pass filter 542 operates to smooth and reshape the signal by removing high frequencies. The second LPF 542 has an output connected to a second limit amplifier 544 which operates to remove unwanted transient fluctuations from the signal by suppressing ripples at "1" levels. The second limit amplifier 544 has an output connected to output 444 of the 10 Gbps optical RZ-electrical NRZ converter 440.

Numerous modifications and variations of the present invention are possible in light of the above teachings. It is therefore to be understood that within the scope of the appended claims, the invention may be practiced otherwise than as specifically described herein. For example other embodiments constructed according to the invention are envisioned which provide higher rate data signals and test components and subsystems of higher data rate specifications such as in the 80 Gbps regime. To achieve such a data rate level instead of four 10 Gbps PRBS data streams, the PPG 160 would produce eight 10 Gbps PRBS data streams, and instead of four 10 Gbps PRBS data streams, the ED 170 would accept eight 10 Gbps PRBS data streams. The 80 Gbps RZ and NRZ source (corresponding to the 40 Gbps version 260A) would be adapted to receive 80 Gbps, and the 80 Gbps RZ and RZ Detector (corresponding to the 40 Gbps version 260B) would be adapted to send 80 Gbps. Components corresponding to multiplexers 330 and 332 would each be 4:1 Multiplexers, with four 10 Gbps data inputs each. A clock multiplier corresponding to clock multiplier 300 would be a 4× multiplier, quadrupling the incoming clock signal. An optical source corresponding to optical source 340 would be an optical 40 GHz pulse source. The optical MUX Chip corresponding to 310 would be an 80 Gbps Optical MUX chip. A converter corresponding to the 40 Gbps optical RZ-NRZ converter would be an 80 Gbps optical RZ-NRZ converter. Outputs corresponding to 376, 377, 370, 375, 371, and 374 would all have double the data rate or frequency capacity as that shown in FIG. 10. The demultiplexer corresponding to the 1:4 demultiplexer 430 would be a 1:8 demultiplexer when it becomes available. The inputs corresponding to 378 and 372 would be twice the data rate capacity as that shown in FIG. 11. The converter corresponding to 450 would be an 80 Gbps optical NRZ-optical RZ converter. An Optical DEMUX module corresponding to 410 would be an 80–10 Gbps optical DEMUX Module. The corresponding RZ-NRZ and NRZ-RZ converters could be attained by replacing the 40 Gbps PIN/TIAs and the 40 Gbps EAMs with corresponding 80 Gbps PIN/TIAs and 80 Gbps EAMs when they become available. The four paths and the components therein, beginning with the 40 Gbps–10 Gbps optical DEMUX Module 410 connected to the four 10 Gbps optical RZ-electrical NRZ converters 440a, 440b, 440c, and 440d respectively connected to the four 10 Gbps Decision Circuits 470a, 470b, 470c, and 470d, respectively connected to the first, second, third, and fourth electrical 1:2 switches 475a, 475b, 475c, and 475d, which are connected to the 1:4 demultiplexer with CDR 430, and the outputs 268a, 268b, 268c, and 268d of the 40 Gbps RZ and NRZ Detector 260B, are replaced by eight analogous paths. In this manner, simply by improving rate and capacity specifications of the individual components of the preferred embodiment and by duplicating parallel paths and the components therein, an MPBERT capable testing at an 80 Gbps data rate can be constructed according to this invention. In alternate arrangements it may be that, due to the limitations of components in the electrical domain, only the optical portion of the 40 Gbps RZ and NRZ Detector 260B may be upgradable to 80 Gbps. In this case the input 378 would remain only capable of receiving 40 Gbps, and the demultiplexer 430 would remain a 1:4 demultiplexer connected only to four of the 1:2 switches, for example switches 475a, 475b, 475c, and 475d. Such a situation is an important example of the advantage of having a portion of the MPBERT designed to operate in the optical domain. In general, practitioners in the art can use the approach as taught by this invention to construct an MPBERT according to the invention having a higher data rate capability than the preferred embodiments described herein, by replacing the various components with corresponding components of higher data rate and capacity specifications and duplicating parallel paths and the components therein, without departing from the scope of the invention, or indeed even the basic architectural design of the preferred embodiment.

We claim:

1. A bit error rate tester comprising:
   an optical multiplexer for multiplexing plurality of input signals and supplying a plurality of test pattern data signals for injection into a device under test;
   an optical pulse source from which an optical pulse stream is provided to the optical multiplexer to be modulated with at least one test pattern data signal multiplexed therein; and
   an optical converter adapted to convert an optical RZ signal having a data rate into an optical NRZ signal having the same data rate and an electrical NRZ signal having the same data rate,
   wherein the optical RZ signal the converter is adapted to convert is an optical RZ signal produced by the optical multiplexer, and wherein the optical NRZ signal and the electrical NRZ signal are for injection into the device under test.

2. A bit error rate tester according to claim 1 further comprising:
   an optical converter adapted to convert an optical NRZ signal having a data rate into an optical RZ signal having the same data rate,
   wherein the optical NRZ signal the optical converter is adapted to convert is an optical NRZ recovered data signal from the device under test.

3. A bit error rate tester according to claim 2 wherein the optical converter comprises:

a PIN photodiode/transimpedance amplifier for converting an optical NRZ signal into an electrical NRZ signal; and an optical pulse source synchronized with the electrical NRZ signal modulated by an electro-absorption modulator for converting the electrical NRZ signal into an optical RZ signal.

4. A bit error rate tester according to claim 1 wherein the optical converter comprises:

a PIN photodiode/transimpedance amplifier for converting an optical RZ signal into an electrical RZ signal;

a low pass filter and a limit amplifier for converting an electrical RZ signal into an electrical NRZ signal; and an optical continuous wave source and an electroabsorption modulator for converting an electrical NRZ signal into an optical NRZ signal.

5. A bit error rate tester comprising:

an optical multiplexer for multiplexing at least one test pattern data signal for injection into a device under test;

an optical pulse source from which an optical pulse stream is provided to the optical multiplexer to be modulated with the at least one test pattern data signal multiplexed therein;

an optical demultiplexer for demultiplexing a recovered data signal from the device under test;

a first optical converter adapted to convert a first optical RZ signal having a first data rate into a first optical NRZ signal having the first data rate and a first electrical NRZ signal having the first data rate, wherein the first optical RZ signal the first optical converter is adapted to convert is an optical RZ signal produced by the optical multiplexer, and wherein the first optical NRZ signal and the first electrical NRZ signal are for injection into the device under test; and a second optical converter adapted to convert a second optical NRZ signal having a second data rate into a second optical RZ signal having the second data rate, wherein the second optical NRZ signal the second optical converter is adapted to convert is an optical NRZ recovered data signal from the device under test.

6. A bit error rate tester according to claim 5 wherein the first optical converter comprises a first PIN photodiode/transimpedance amplifier for converting the first optical RZ signal into an electrical RZ signal, a low pass filter and a limit amplifier for converting the electrical RZ signal into a second electrical NRZ signal, and an optical continuous wave source and a first electro-absorption modulator for converting the second electrical NRZ signal into the first optical NRZ signal, and wherein the second optical converter comprises a second PIN photodiode/transimpedance amplifier for converting the second optical NRZ signal into a third electrical NRZ signal, an optical pulse source synchronized with the third electrical NRZ signal, and a second electro-absorption modulator for converting the third electrical NRZ signal into the second optical RZ signal.

7. A method of bit error rate testing comprising:

optically multiplexing a plurality of test pattern data signals for injection into a device under test;

optically demultiplexing a recovered data signal from the device under test; and optically converting an optical RZ signal having a data rate into optical NRZ signal having the same data rate and an electrical NRZ signal having the same data rate, wherein the optical RZ signal is a multiplexed optical RZ signal, and wherein the optical NRZ signal and the electrical NRZ signal are for injection into the device under test.

8. A method of bit error rate testing according to claim 7 further comprising:

optically converting an optical NRZ signal having a data rate into an optical RZ signal having the same data rate, wherein the optical NRZ signal is a multiplexed optical NRZ recovered data signal from the device under test.

9. A method of bit error rate testing according to claim 8 further comprising:

converting an optical NRZ signal into an electrical NRZ signal; and converting an electrical NRZ signal into an optical RZ signal.

10. A method of bit error rate testing according to claim 7 further comprising:

converting an optical RZ signal into an electrical RZ signal;

converting an electrical RZ signal into an electrical NRZ signal; and converting an electrical NRZ signal into an optical NRZ signal.

11. A method of bit error rate testing comprising:

optically multiplexing at least one test pattern data signal for injection into a device under test;

optically demultiplexing a recovered data signal from the device under test;

optically converting a first optical RZ signal having a first data rate into a first optical NRZ signal having the first data rate and a first electrical NRZ signal having the first data rate, wherein the first optical RZ signal is a multiplexed optical RZ signal, and wherein the first optical NRZ signal and the first electrical NRZ signal are for injection into the device under test; and optically converting a second optical NRZ signal having a second data rate into a second optical RZ signal having the second data rate, wherein the second optical NRZ signal is a multiplexed optical NRZ recovered data signal from the device under test.

* * * * *

UNITED STATES PATENT AND TRADEMARK OFFICE
CERTIFICATE OF CORRECTION

PATENT NO. : 6,950,972 B2
APPLICATION NO. : 09/988059
DATED : September 27, 2005
INVENTOR(S) : Tiangong Liu, Jinghui Li and Tongqing Wang It is certified that error appears in the above-identified patent and that said Letters Patent is hereby corrected as shown below:

One the Title page, (item 56), Other Publications, second article listed (Shake et al.);
Replace: "Shake et al, Determination of the origin BER degradation utlizing asynchronous amplitude histograms, Jul. 2001, Laser & Electro-Optics 2001 C/EO? Pasific RIM 2001.vol.2. the 4$^{th}$ Pacific Rim Conference vol. 2., p. II-560 to II-561." with
-- Shake et al., Determination of the origin of BER degradation utilizing asynchronous amplitude histograms, Jul. 2001, Laser & Electro-Optics 2001 C/EO? Pacific RIM 2001. the 4$^{th}$ Pacific Rim Conference Vol. 2, p. II-560 to II-561. --

In the Specification, Column 5, Line 31; Replace:
"optically converting a second optical RZ signal" with
-- optically converting a second optical NRZ signal --

In the Specification, Column 7, Line 57; Replace:
"DUT 280, An electrical" with
-- DUT 280. An electrical --

In the Specification, Column 8, Line 36; Replace:
"40 Gbps RZ and NR2" with
-- 40 Gbps RZ and NRZ --

In the Specification, Column 8, Line 66; Replace:
"WRZ signal" with
-- NRZ signal --

In the Specification, Column 13, Line 22; Replace:
"470a, 470b, 470c, and 470a." with
-- 470a, 470b, 470c, and 470d. --

UNITED STATES PATENT AND TRADEMARK OFFICE
CERTIFICATE OF CORRECTION

PATENT NO. : 6,950,972 B2
APPLICATION NO. : 09/988059
DATED : September 27, 2005
INVENTOR(S) : Tiangong Liu, Jinghui Li and Tongqing Wang It is certified that error appears in the above-identified patent and that said Letters Patent is hereby corrected as shown below:

In the Claims, Column 17, Lines 51-52 ; Replace:
"NRZ signal into the first optical NRZ signal, and wherein the second optical converter comprises" with
-- NRZ signal into the first optical NRZ signal, and wherein the second optical converter comprises --

Signed and Sealed this

Nineteenth Day of December, 2006

JON W. DUDAS
*Director of the United States Patent and Trademark Office*